United States Patent
Iwane et al.

(10) Patent No.: US 12,320,856 B2
(45) Date of Patent: Jun. 3, 2025

(54) CHARGEABLE BATTERY STATE DETECTION APPARATUS AND CHARGEABLE BATTERY STATE DETECTION METHOD

(71) Applicants: FURUKAWA ELECTRIC CO., LTD., Tokyo (JP); FURUKAWA AUTOMOTIVE SYSTEMS INC., Shiga (JP)

(72) Inventors: Noriyasu Iwane, Tokyo (JP); Etsuzo Sato, Tokyo (JP); Yuichi Watanabe, Shiga (JP); Kazuyoshi Sato, Shiga (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 508 days.

(21) Appl. No.: 17/459,514

(22) Filed: Aug. 27, 2021

(65) Prior Publication Data

US 2021/0389383 A1  Dec. 16, 2021

Related U.S. Application Data

(63) Continuation of application No. PCT/JP2020/008287, filed on Feb. 28, 2020.

(30) Foreign Application Priority Data

Feb. 28, 2019 (JP) ................................. 2019-037067

(51) Int. Cl.
  *G01R 31/3842* (2019.01)
  *G01R 31/36* (2020.01)
  (Continued)

(52) U.S. Cl.
  CPC ..... *G01R 31/3842* (2019.01); *G01R 31/3648* (2013.01); *H01M 10/48* (2013.01); *H02J 7/0048* (2020.01)

(58) Field of Classification Search
  CPC .......... G01R 31/3842; G01R 31/3648; H01M 10/48; H01M 2010/4271;
  (Continued)

(56) References Cited

U.S. PATENT DOCUMENTS 5,670,861 A     9/1997  Nor
8,078,416 B2 *  12/2011 Iwane ................. G01R 31/367
                                                          702/65

(Continued)

FOREIGN PATENT DOCUMENTS

JP  2002-071769 A  3/2002
JP  2005-043339 A  2/2005
(Continued)

OTHER PUBLICATIONS

Japanese Office Action dated Jul. 19, 2023 for Japanese Patent Application No. 2021-502394, 10 pages (including translation).

(Continued)

*Primary Examiner* — Mohammad K Islam
(74) *Attorney, Agent, or Firm* — Amin, Turocy & Watson, LLP (57) ABSTRACT

A chargeable battery state detection apparatus configured to detect a state of a chargeable battery is provided, comprising processor(s) and memorie(s) communicatively connected to the processor(s), wherein the processor(s) read out a group of instructions stored in the memorie(s), and execute a detection process for detecting a voltage and a current of the chargeable battery; a storage process for storing voltage values detected at different times by the detection process after charge and discharge is stopped; a fitting process for (Continued)

fitting, with respect to the voltage values, by adjusting coefficients of a predetermined function; a calculation process for calculating an open circuit voltage based on the function; and a discard process for discarding at least a part of the voltage values stored by the storage process when a current value or a voltage value detected by the detection process fluctuates by a predetermined threshold value or greater.

20 Claims, 6 Drawing Sheets

(51) Int. Cl.
*H01M 10/48* (2006.01)
*H02J 7/00* (2006.01)

(58) Field of Classification Search
CPC ......... H01M 2010/4278; H01M 10/425; H02J 7/0048; Y02E 60/10
See application file for complete search history.

(56) References Cited

U.S. PATENT DOCUMENTS

| | | |
|---|---|---|
| 2006/0208704 A1 | 9/2006 | Iwane et al. |
| 2009/0030626 A1 | 1/2009 | Iwane et al. |
| 2021/0190876 A1* | 6/2021 | Takechi ............. G01R 31/3842 |

FOREIGN PATENT DOCUMENTS

| | | |
|---|---|---|
| JP | 2010-286445 A | 12/2010 |
| JP | 2015-224919 A | 12/2015 |
| JP | 2017-181326 A | 10/2017 |
| JP | 2018-169183 A | 11/2018 |
| JP | 2018-179710 A | 11/2018 |

OTHER PUBLICATIONS

Extended European Search Report issued in the EP Patent Application No. 20763780.2, mailed on Mar. 18, 2022, 8 pages.

* cited by examiner

| VOLTAGE MEASUREMENT TIMING (SECOND) | APPLICATION OF EACH TERM OF EXPONENTIAL DECAY FUNCTION (FOURTH ORDER) |
|---|---|
| 0 TO 10 SECONDS | FIRST TERM + SECOND TERM + THIRD TERM + FOURTH TERM |
| 10 TO 60 SECONDS | SECOND TERM + THIRD TERM + FOURTH TERM |
| 60 TO 600 SECONDS | THIRD TERM + FOURTH TERM |
| 600 SECONDS OR MORE | FOURTH TERM |

FIG. 6

CHARGEABLE BATTERY STATE DETECTION APPARATUS AND CHARGEABLE BATTERY STATE DETECTION METHOD

CROSS-REFERENCE TO RELATED APPLICATIONS

This application is a continuation of, and claims priority to each of, international Patent Cooperation Treaty (PCT) Application No. PCT/JP2020/008287, filed Feb. 28, 2020, and entitled "CHARGEABLE BATTERY STATE DETECTION DEVICE AND CHARGEABLE BATTERY STATE DETECTION METHOD" which claims priority to Japanese Patent Application No. 2019-037067, filed on Feb. 28, 2019, the entireties of each of which applications are hereby incorporated by reference herein in their entireties.

TECHNICAL FIELD

The disclosure relates to a chargeable battery state detection apparatus and a chargeable battery state detection method.

BACKGROUND ART

Patent Document 1 discloses a technique, in which after charge and discharge to a chargeable battery is stopped, a voltage of the chargeable battery is measured a plurality of times, an Open Circuit Voltage (OCV) is estimated in a relatively short time period by performing fitting using a predetermined function, and a State Of Charge (SOC) is estimated based on the estimated open circuit voltage.

CITATION LIST

Patent Documents

Patent Document 1: JP 2005-43339A

SUMMARY

Technical Problem

In a case of a recent vehicle and the like equipped with a large number of electronic devices, since the large number of electronic devices operates independently, a value of the dark current fluctuates according to time even in a state when the vehicle is stopped. In such a case, in addition to the original voltage change behavior according to the time of the polarization, the voltage fluctuation due to the current is superimposed, and there is a problem that it is difficult to correctly estimate the open circuit voltage.

The disclosure is made under such circumstances as described above, and has an object to provide the chargeable battery state detection apparatus and the chargeable battery state detection method capable of accurately estimating an open circuit voltage regardless of the influence of the dark current.

Solution to Problem

In order to solve the above-described problem, the disclosure is a chargeable battery state detection apparatus for detecting a state of a chargeable battery, the apparatus including: one or a plurality of processors and one or a plurality of memories communicatively connected to the one or the plurality of processors, wherein the one or the plurality of processors read out a group of instructions stored in the one or the plurality of memories, and execute: a detection process for detecting a voltage and a current of the chargeable battery based on signals output from a voltage detecting unit and a current detecting unit; a storage process for storing a plurality of voltage values detected at different times by the detection process after charge and discharge of the chargeable battery is stopped; a fitting process for fitting, with respect to the plurality of voltage values stored by the storage process, by adjusting coefficients of a predetermined function; a calculation process for calculating an open circuit voltage based on the function, the coefficients of the function being adjusted by the fitting process; and a discard process for discarding at least a part of the plurality of voltage values stored by the storage process when a current value or a voltage value detected by the detection process fluctuates by a predetermined threshold value or greater.

Regardless of the influence of the dark current, the open circuit voltage can be accurately estimated.

In the disclosure, the function is: an exponential decay function having one or a plurality of terms; or an inverse proportion function.

According to such a configuration, the open circuit voltage can be accurately obtained with a simple calculation.

In the disclosure, when the current value or the voltage value detected by the detection process fluctuates by the predetermined threshold value or greater, the discard process discards all the plurality of voltage values stored by the storage process.

According to such a configuration, interpolation process and the like is not necessary by discarding all the voltage values, so that the process can be simplified.

In the disclosure, the function is an exponential decay function having one or a plurality of terms, and when storage of a voltage value is resumed after all the voltage values are discarded by the discard process, the number of the terms in the exponential decay function is reduced according to an elapsed time at that time.

According to such a configuration, appropriate number of terms can be set according to the resumed timing.

In the disclosure, when the open circuit voltage cannot be calculated for a predetermined period or more due to execution of discard by the discard process, the threshold value of the discard process is adjusted to be large.

According to such a configuration, an appropriate threshold value can be selected.

Furthermore, a state of charge of the chargeable battery is calculated based on the open circuit voltage, and charge control of the chargeable battery is executed by the chargeable battery itself or by an external ECU, based on the obtained state of charge.

According to such a configuration, accurate charge and discharge control can be executed based on the state of charge calculated based on the open circuit voltage.

Furthermore, the storage process records the number of detection of the voltage value detected by the detection process after charge and discharge of the chargeable battery is stopped, and in a case in which discard by the discard process is executed, the number of detection is reset to zero.

According to such a configuration, the open circuit voltage can be appropriately calculated even when the discard process is executed.

The fitting process is executed on a predetermined number or greater of voltage values, and a number of the voltage values discarded by the discard process are not included in the predetermined number.

According to such a configuration, the number of voltage data is not decreased even when the discard process is executed, and thus the accuracy of the calculation of the open circuit voltage can be maintained.

Furthermore, when fluctuation of the voltage value equal to the predetermined threshold value or greater is repeated a predetermined number of times or more, before a number of the voltage value stored by the storage process becomes equal to the predetermined number or greater, detection of the state of the chargeable battery is stopped.

According to such a configuration, the occurrence of useless processes due to the repetition of the discard process can be minimized.

Furthermore, the disclosure is a chargeable battery state detection method for detecting a state of a chargeable battery, the method including: a detecting step of detecting a voltage and a current of the chargeable battery based on signals output from a voltage detecting unit and a current detecting unit, a storage step of storing, in a memory, a plurality of voltage values detected at different times by the detecting step after charge and discharge of the chargeable battery is stopped, a fitting step of fitting, with respect to the plurality of voltage values stored in the memory, by adjusting fitting coefficients of a predetermined function, a calculation step of calculating an open circuit voltage based on the function, the coefficients of the function being adjusted by the fitting step, and a discard step of discarding at least a part of the plurality of voltage values stored in the memory when a current value or a voltage value detected by the detection process fluctuates by a predetermined threshold value or greater.

According to such a method, regardless of the influence of the dark current, the open circuit voltage can be accurately estimated.

Advantageous Effects of Invention

According to the disclosure, the chargeable battery state detection apparatus and the chargeable battery state detection method capable of accurately estimating an open circuit voltage regardless of the influence of the dark current can be provided.

DESCRIPTION OF EMBODIMENTS

Next, an embodiment of the disclosure will be described.

(A) Description of Configuration According to Embodiment of Disclosure

Figure 1:
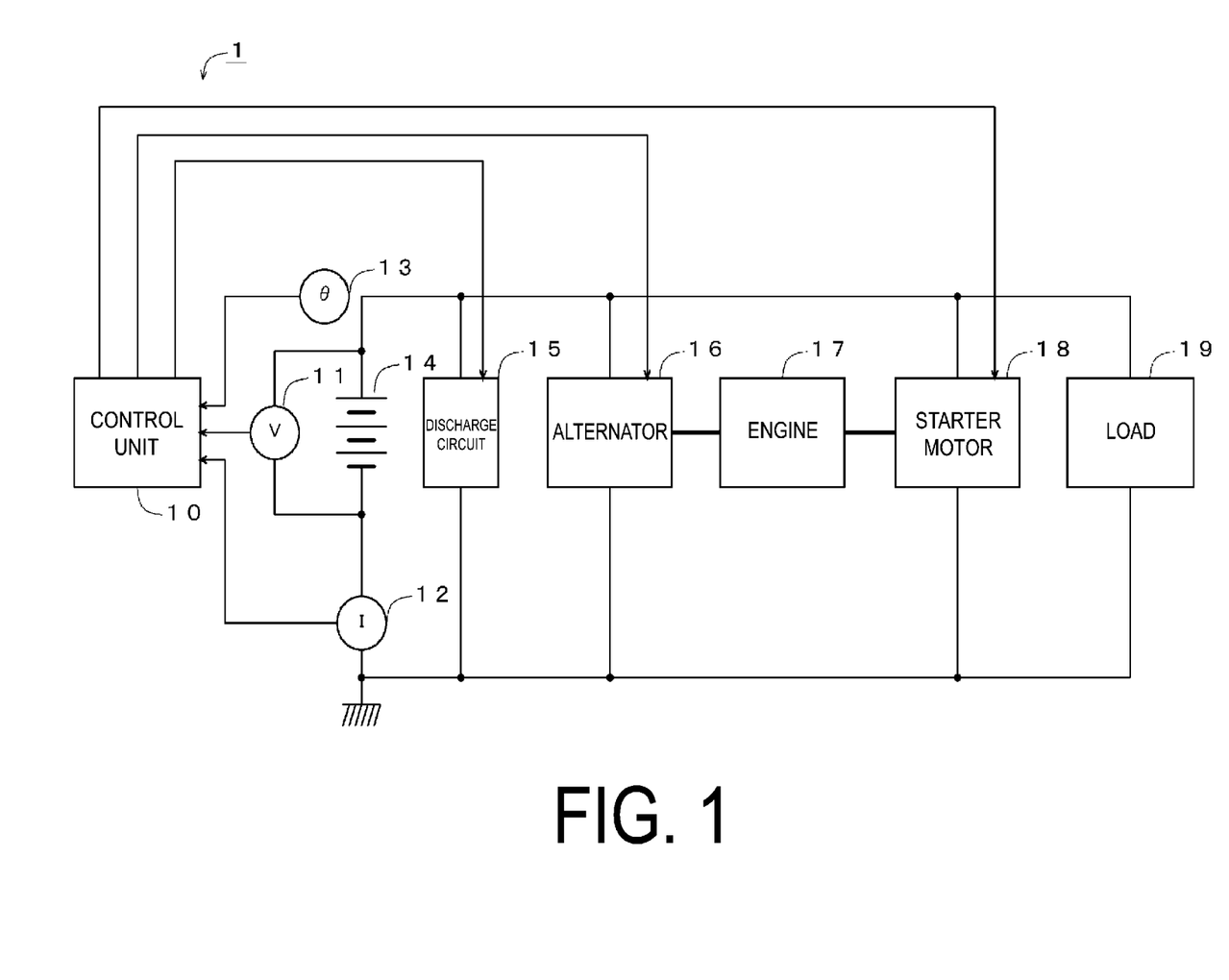
FIG. 1 is a diagram illustrating a configuration example of a chargeable battery state detection apparatus according to an embodiment of the disclosure.

FIG. 1 is a diagram illustrating a vehicle power supply system including a chargeable battery state detection apparatus according to an embodiment of the disclosure. In the diagram, a chargeable battery state detection apparatus 1 is configured by a control unit 10 as a main component, and a voltage measurement unit 11 serving as a voltage detecting unit, a current measurement unit 12 serving as a current detecting unit, a temperature measurement unit 13 serving as a temperature detecting unit, and a discharge circuit 15 are connected to the outside to detect a state of a chargeable battery 14. Note that the control unit 10, the voltage measurement unit 11, the current measurement unit 12, the temperature measurement unit 13, and the discharge circuit 15 may be not separately configured, and some or all of these may be configured together.

Here, the control unit 10 refers to outputs from the voltage measurement unit 11, the current measurement unit 12, and the temperature measurement unit 13, detects the state of the chargeable battery 14 and outputs information of the detected result to the outside, and controls a charge state of the chargeable battery 14 by controlling a generated voltage of an alternator 16. Note that, instead of the control unit 10 controlling the charge state of the chargeable battery 14 by controlling the generated voltage of the alternator 16, for example, an Electric Control Unit (ECU) (external control unit), which is not illustrated, may control the charge state based on information from the control unit 10.

The voltage measurement unit 11 detects a terminal voltage of the chargeable battery 14, and supply the detected results as a voltage signal to the control unit 10. The current measurement unit 12 detects a current flowing in the chargeable battery 14, and supply the detected results as a current signal to the control unit 10.

The temperature measurement unit 13 detects a temperature of an electrolytic solution of the chargeable battery 14 or an ambient temperature (for example, absolute temperature) of the chargeable battery 14, and supply the detected results as a temperature signal to the control unit 10. For example, a thermistor, a temperature measurement resistor, a thermocouple, and an Integrated Circuit (IC) temperature measurement unit can be used as the temperature measurement unit 13. Note that an infrared measurement unit configured to sense infrared light may be used.

The discharge circuit 15 is composed of, for example, a semiconductor switch and a resistance element connected in series, and can discharge the chargeable battery 14 in a desired waveform by performing on/off of the semiconductor switch according to the control of the control unit 10.

The alternator 16 is driven by an engine 17, generates AC power and converts the generated AC power into DC power through a rectifier circuit, and charges the chargeable battery 14. The alternator 16 is controlled by the control unit 10, and can adjust the generated voltage.

The engine 17 is: a reciprocating engine such as a petrol engine or a diesel engine; or a rotary engine, for example. The engine 17 is started by a starter motor 18 and drives drive wheels via a transmission to supply propulsive power to the vehicle. The engine 17 also drives the alternator 16 to generate electric power. For example, the starter motor 18 is a DC motor, and generates a rotational force by using electric power supplied from the chargeable battery 14 to start the engine 17. Note that instead of the engine 17, an electric motor may be used.

For example, a load 19 is formed by an electric power steering motor, a defogger, a seat heater, an ignition coil, a car audio system, a car navigation system, and the like. The load 19 runs on electric power supplied from the chargeable battery 14. Note that in the example of FIG. 1, only the engine 17 is configured to output a driving power, but, for example, a hybrid vehicle equipped with an electric motor that assists the engine 17 may also be configured to output the driving power. In the case of the hybrid vehicle, the chargeable battery 14 activates a high voltage system (system for driving the electric motor) formed by a lithium battery and the like, and the high voltage system starts the engine 17.

Figure 2:
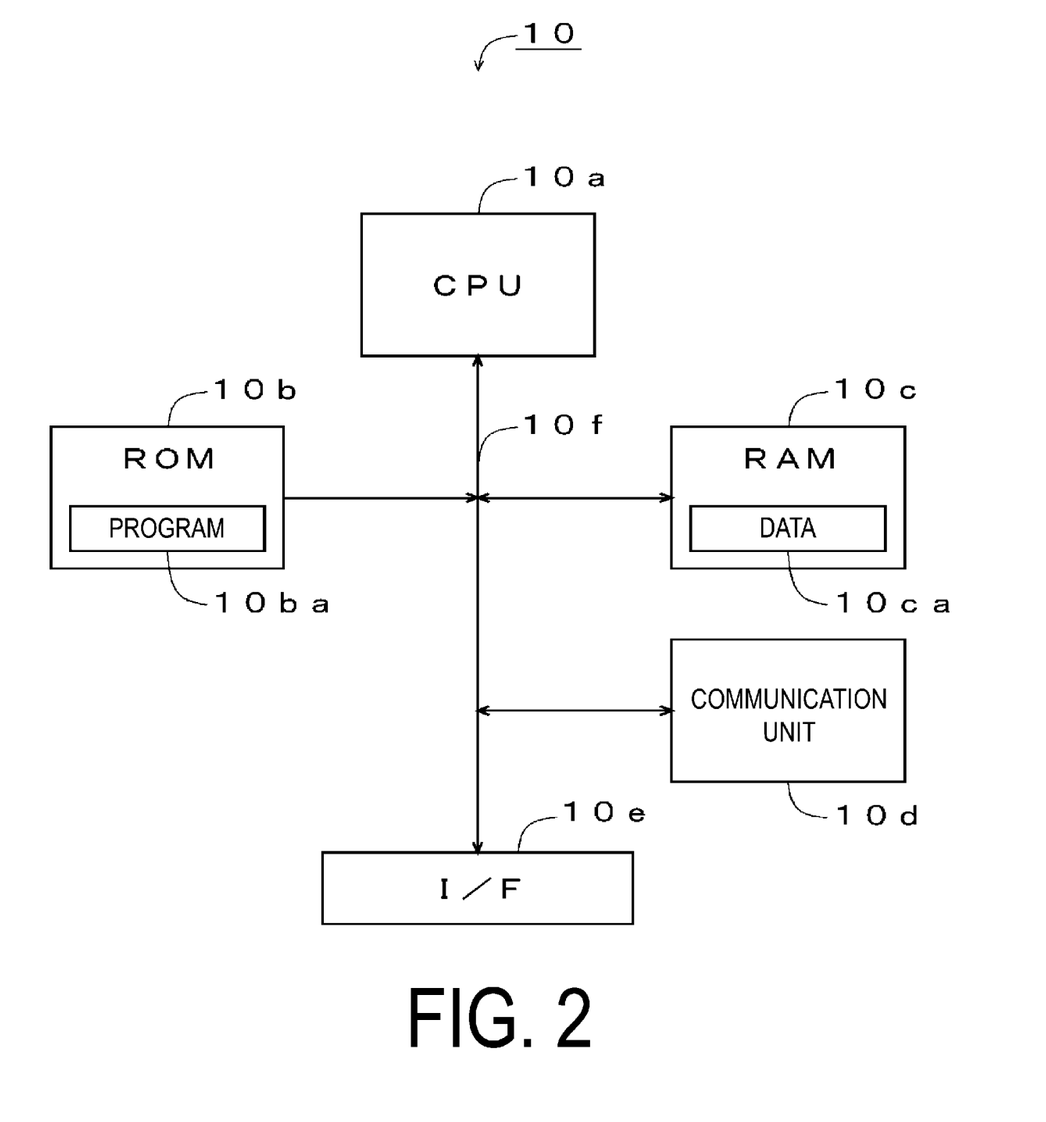
FIG. 2 is a block diagram illustrating a detailed configuration example of a control unit of FIG. 1.

FIG. 2 is a diagram illustrating a detailed configuration example of the control unit 10 illustrated in FIG. 1. As illustrated in the diagram, the control unit 10 is, for example, a one chip microcomputer and includes a Central Processing Unit (CPU) 10*a* serving as a processor, a Read Only Memory (ROM) 10*b*, a Random Access Memory (RAM) 10*c*, a communication unit 10*d*, an Interface (I/F) 10*e*, and a bus 10*f*. Here, the CPU 10*a* controls components, based on a program 10*ba* stored in the ROM 10*b*. The ROM 10*b*, which is, for example, a semiconductor memory, stores the program 10*ba* and the like. The RAM 10*c* is a semiconductor memory and the like, and stores data 10*ca*, such as a data generated at a time of execution of the program 10*ba*, a table, and the like. The communication unit 10*d* performs communication with an ECU serving as a higher-level device, for example, and reports detected information or control information to the higher-level device. The I/F 10*e* imports a voltage signal, a current signal, and a temperature signal supplied from the voltage measurement unit 11, the current measurement unit 12, and the temperature measurement unit 13, by converting the signals into digital signals, and supplies a driving current to the discharge circuit 15, the alternator 16, and the starter motor 18, for example, to control the same. The bus 10*f* is a group of signal lines for connecting the CPU 10*a*, the ROM 10*b*, the RAM 10*c*, the communication unit 10*d*, and the I/F 10*e* to one another, and for enabling these to exchange information with one another. Note that the control of the alternator 16, the starter motor 18, and the like may be executed by the ECU. The disclosure is not limited to the configuration of FIG. 1.

Note that, in the example illustrated in FIG. 2, one CPU 10*a*, one ROM 10*b*, and one RAM 10*c* are provided, but a plurality of them may be provided. In addition, one or a plurality of CPU 10*a* may read the instruction group stored in one or a plurality of ROM 10*b* and RAM 10*c*. Furthermore, the distributed processes may be executed by a plurality of CPUs. In addition, a Digital Signal Processor (DSP), a Field Programmable Gate Array (FPGA), or an Application Specific Integrated Circuit (ASIC) may be used in place of the CPU 10*a*. Alternatively, the processing may be executed by a general-purpose processor that executes functions by reading a software program or by a computer on a server by cloud computing. In FIG. 2, the ROM 10*b* and the RAM 10*c* are included, but for example, a memory device other than these (for example, a Hard Disk Drive (HDD), which is a magnetic memory device) may be used.

(B) Description of Operation According to Embodiment of Disclosure

Next, operation according to embodiments of the disclosure will be described. Note that the operations according to the embodiments of the disclosure will be first described below, and then processing in a flowchart for realizing such operations will be described.

First, the outline of the operations according to the embodiments of the disclosure will be described. In a case in which the charge state of the chargeable battery 14 is controlled, the alternator 16 needs to be controlled based on the SOC, which is the state of charge. Thus, in order to keep the chargeable battery 14 in an appropriate state so as not to be overcharged or overdischarged, it is necessary to know an accurate SOC.

Since the SOC has a correlation with the OCV, which is an open circuit voltage, an accurate SOC can be obtained by obtaining an accurate OCV. However, when the vehicle is operating, polarization occurs due to repeated charge and discharge, and the influence of the polarization makes it difficult to obtain the accurate OCV. In order to eliminate the polarization, it takes an extremely long period of time, for example, from ten and several hours to several days after the engine 17 is stopped, so that it is difficult to measure the accurate OCV in a usage mode in which the vehicle is used daily.

Thus, in this embodiment, when the engine 17 of the vehicle is stopped and the chargeable battery 14 is in a stable state, by measuring the voltage of the chargeable battery 14 a plurality of times and fitting the measured voltage (adjusting coefficients) to a predetermined function. the OCV is estimated. Then, the accurate SOC is obtained by the correlation between the estimated OCV and SOC, and the charge and discharge control of the chargeable battery 14 is executed based on the obtained accurate SOC.

Figure 3:
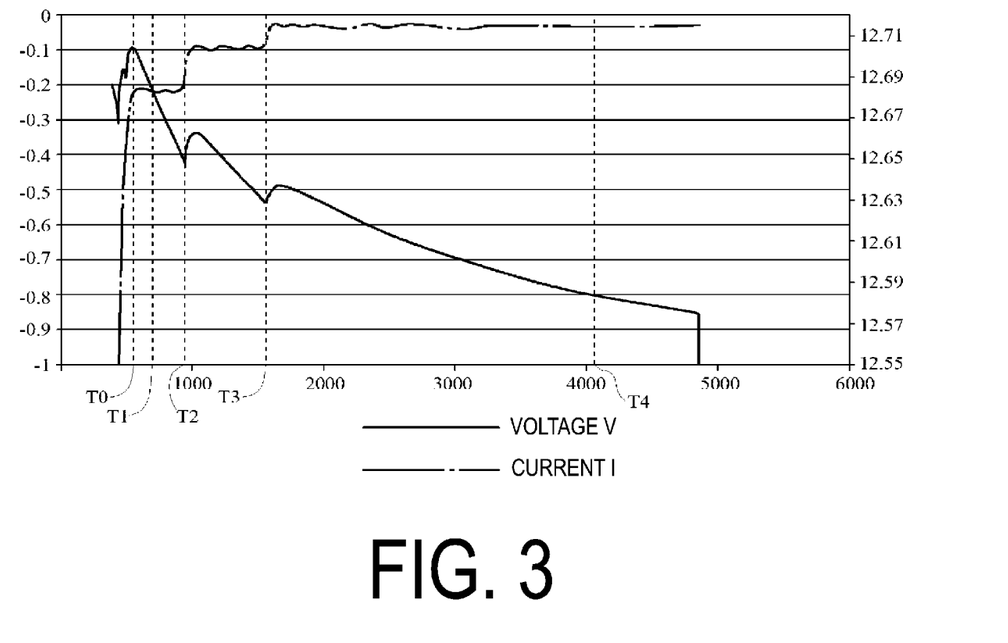
FIG. 3 is a graph showing changes in a voltage and a current of the chargeable battery after the charge and discharge is stopped.

In the chargeable battery 14 mounted on the vehicle, a dark current may flow in the load 19 even after the engine 17 is stopped. In other words, the supply of power to the load 19 is not interrupted at the same time when the engine 17 is stopped, but the supply of power is stopped, for example, after the end operation of the load 19. Thus, as illustrated in FIG. 3, after the engine 17 is stopped at the time T0, the current flowing in the chargeable battery 14 gradually decreases (decreases in stages in FIG. 3), as indicated by the dashed line. Note that in FIG. 3, the horizontal axis represents time (seconds), the vertical axis on the left side represents current (A) (minus indicates the discharge from the chargeable battery 14), and the vertical axis on the right side represents voltage (V).

Thus, as indicated by the solid line in FIG. 3, the voltage of the chargeable battery 14 changes discontinuously according to the change in the current. When the voltage changes discontinuously in this way, the fitting using a function cannot be executed with high accuracy.

Thus, in the present embodiment, the current is measured together when the voltage is measured a plurality of times, and when the current (dark current) equal to the predetermined threshold value or greater flows, the continuity of the voltage cannot be ensured, so that the measurement data (voltage values) obtained by then is discarded, and the voltage measurement is executed from the beginning. Then, the fitting is executed based on a certain amount of measurement data and the OCV is calculated. Thus, a more accurate OCV can be estimated.

Next, more specific operations will be described. In the present embodiment, an exponential decay function of fourth order or greater is used as the fitting function. As a matter of course, other functions may be used. The following Equation (1) shows an exponential decay function of n-th order. Where, a1, a2, . . . an, b1, b2, . . . bn, and c represent coefficients.

[Equation 1]

$$Y = a_1 \cdot \exp(-b_1 \cdot X) + a_2 \cdot \exp(-b_2 \cdot X) + a_3 \cdot \exp(-b_3 \cdot X) + a_4 \cdot \exp(-b_4 \cdot X) + \ldots + a_n \cdot \exp(-b_n \cdot X) + c \quad (1)$$

In the above-described Equation (1), when the input X is the elapsed time and the output Y is the open circuit voltage, the open circuit voltage at any given point in time can be obtained by determining (fitting) the value of each of the coefficients so that the measured value of the voltage of the chargeable battery 14 coincides with the value of the Equation (1).

Note that, it has been found by experiments that sufficient accuracy can be obtained by setting n=4 or greater in the Equation (1). Thus, the case where n=4 is described below as an example.

Figure 4:
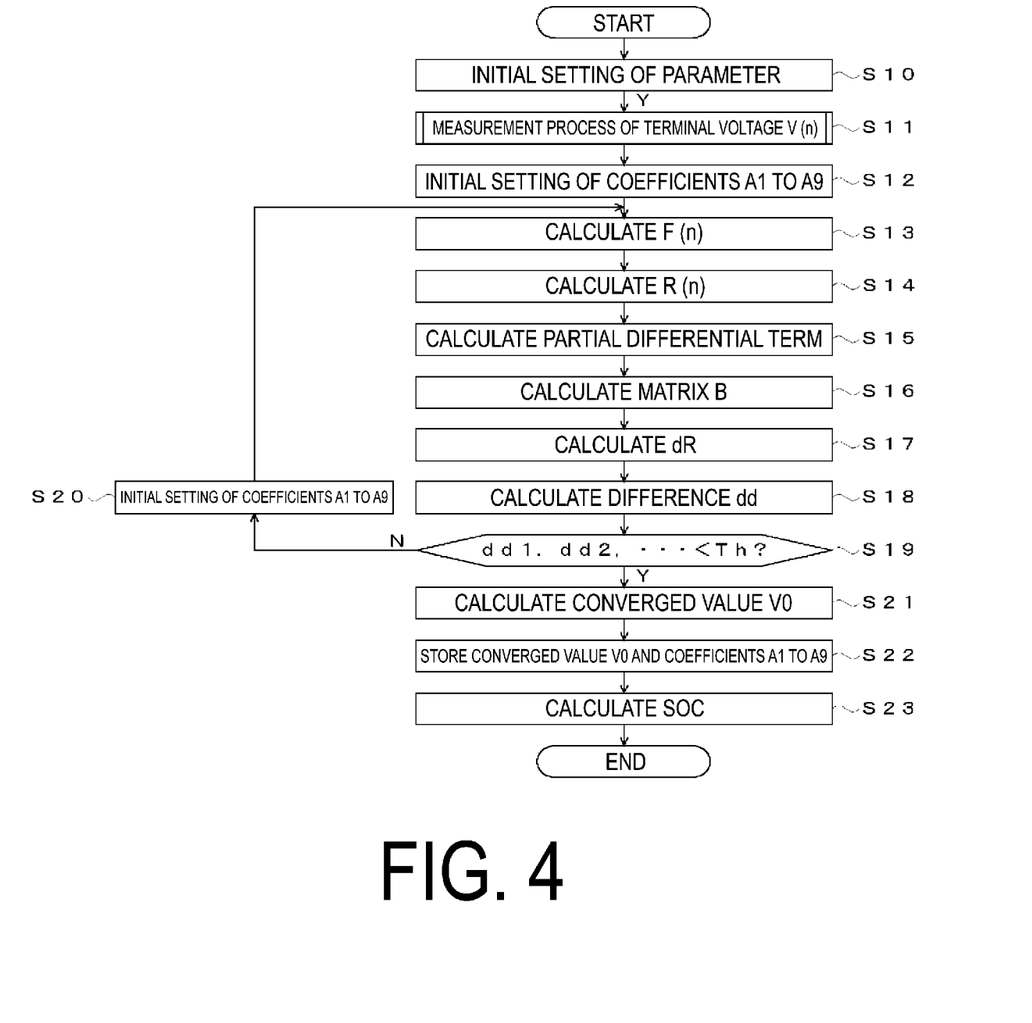
FIG. 4 is a flowchart for explaining an example of processing executed when an engine is stopped in the embodiment of the disclosure.

FIG. 4 is a flowchart for explaining an example of processing executed in the present embodiment. When the processing in the flowchart illustrated in FIG. 4 are started, the following steps are executed.

In Step S10, the CPU 10a of the control unit 10 executes initial setting of parameters necessary for the arithmetic processing. The parameters to be subjected to the initial setting include: a sampling interval ΔTs when the voltage sample value of the chargeable battery 14 is acquired, the number of acquired samples Ns, and a stabilization time Tx required until the open circuit voltage of the chargeable battery 14 is stabilized. As an example, values such as ΔTs=10 (seconds), Ns=60 (pieces), and Tx=100000 (seconds) can be set. A fixed initial setting value according to the characteristics of the chargeable battery 14 can be predetermined, but the initial setting value may be appropriately changed according to the operation condition and the like.

In Step S11, the CPU 10a executes a process for measuring a terminal voltage of the chargeable battery 14. More specifically, based on the above-described initial setting value, Ns voltage sample values measured at the sampling interval ΔTs are measured sequentially. The CPU 10a stores each measured voltage sample value and the number of measurements as the data 10ca to the RAM 10c and reads out them as needed. In the following, the n-th (n=1, 2, 3 . . . Ns) voltage sample values acquired in Step S11 is denoted as V (n). Note that details of the processing in Step S11 is given later with referring to FIG. 5.

In Step S12, the CPU 10a performs the initial setting of coefficients corresponding to an exponential decay function of fourth order in order to approximate the open voltage characteristics of the chargeable battery 14. Here, as the above-described exponential decay function of fourth order in the arithmetic processing in FIG. 4, F (T) with respect to the time T is used as shown in the following Equation (2). More specifically, the initial values previously stored in the RAM 10c are read out and set for the coefficients A1 to A9 included in the Equation (2). These coefficients A1 to A9 are used to derive an optimal solution based on the least square method by fitting, and the values are updated sequentially in the course of the calculation as described below. Note that values previously obtained experimentally can be used as the initial value for each of the coefficients A1 to A9.

[Equation 2]

$$F(T) = A_1 \cdot \exp(A_5 \cdot T) + A_2 \cdot \exp(A_6 \cdot T) + A_3 \cdot \exp(A_7 \cdot T) + A_4 \cdot \exp(A_8 \cdot T) + A_9 \quad (2)$$

In Step S13, the CPU 10a calculates F (n) expressed by the Equation (3) shown below by applying the exponential decay function F (T) as shown in the Equation (2) to each of the n-th sample timings. As a result, Ns calculated values in total are obtained for F (n).

[Equation 3]

$$F(n) = A_1 \cdot \exp(A_5 \cdot n \cdot \Delta Ts) + A_2 \cdot \exp(A_6 \cdot n \cdot \Delta Ts) + A_3 \cdot \exp(A_7 \cdot n \cdot \Delta Ts) + A_4 \cdot \exp(A_8 \cdot n \cdot \Delta Ts) + A_9 \quad (3)$$

In Step S14, the CPU 10a calculates R (n), which is a difference between F (n) obtained in Step S13 and the voltage sample value V (n) measured in Step S11, for each of the sample timings. In other words, the Ns R (n) expressed by the following Equation (4) below is obtained.

[Equation 4]

$$R(n) = F(n) - V(n) \quad (4)$$

In Step S15, the CPU 10a calculates partial differential terms corresponding to each of the coefficients A1 to A9 upon application of the least square method. More specifically, the partial differential terms corresponding to each of the coefficients A1 to A9 expressed by the following Equation (5) are obtained for each of sample timings.

[Equation 5]

$$dDFA1(n) = \exp(A_5 \cdot n \cdot \Delta Ts)$$

$$dDFA2(n) = \exp(A_6 \cdot n \cdot \Delta Ts)$$

$$dDFA3(n) = \exp(A_7 \cdot n \cdot \Delta Ts)$$

$$dDFA4(n) = \exp(A_8 \cdot n \cdot \Delta Ts)$$

$$dDFA4(n) = A_1 \cdot n \cdot \Delta Ts \, \exp(A_5 \cdot n \cdot \Delta Ts)$$

$$dDFA5(n) = A_2 \cdot n \cdot \Delta Ts \, \exp(A_6 \cdot n \cdot \Delta Ts)$$

$$dDFA4(n) = A_3 \cdot n \cdot \Delta Ts \, \exp(A_7 \cdot n \cdot \Delta Ts)$$

$$dDFA4(n) = A_4 \cdot n \cdot \Delta Ts \, \exp(A_8 \cdot n \cdot \Delta Ts) \quad (5)$$

In Step S16, the CPU 10a calculates a matrix B conforming to the simultaneous equations of the least square method using each of the partial differential terms calculated in Step S15. Specifically, the matrix B expressed by the following Equation (6) is obtained.

[Equation 6]

$$B(1,1) = \sum_{n=1}^{N_s} f\{dDFA1(n)\}^2$$

$$B(1,2) = \sum_{n=1}^{N_s} f\{dDFA1(n) \times dDFA2(n)\}$$

$$B(1,3) = \sum_{n=1}^{N_s} f\{dDFA1(n) \times dDFA3(n)\}$$

$$\vdots$$

$$B(9,9) = \sum_{n=1}^{N_s} f\{dDFA9(n)\}^2 \quad (6)$$

Note that the matrix B shown in the Equation (6) is a square matrix of 9×9, and is a symmetric matrix of B (x, y)=B (y, x).

In Step S17, the CPU 10a calculates dR expressed by the following Equation (7), using the R(n) obtained in Step S14 and the partial differential terms obtained in Step S15.

[Equation 7]

$$dR1 = -\sum_{n=1}^{N_s} \{dDFA1(n) \times R(n)\} \quad (7)$$

$$dR2 = -\sum_{n=1}^{N_s} \{dDFA2(n) \times R(n)\}$$

$$dR3 = -\sum_{n=1}^{N_s} \{dDFA3(n) \times R(n)\}$$

$$dR4 = -\sum_{n=1}^{N_s} \{dDFA4(n) \times R(n)\}$$

$$dR5 = -\sum_{n=1}^{N_s} \{dDFA5(n) \times R(n)\}$$

$$dR6 = -\sum_{n=1}^{N_s} \{dDFA6(n) \times R(n)\}$$

$$dR7 = -\sum_{n=1}^{N_s} \{dDFA7(n) \times R(n)\}$$

$$dR8 = -\sum_{n=1}^{N_s} \{dDFA8(n) \times R(n)\}$$

$$dR9 = -\sum_{n=1}^{N_s} \{dDFA9(n) \times R(n)\}$$

In Step S18, the CPU 10*a* calculates a difference dd expressed by the following Equation (8) using the matrix B obtained in Step S17 and the dR obtained in Step S18. As a result, nine differences dd1 to dd9 corresponding to the coefficients A1 to A9, respectively, are obtained, and based on these, the optimal solution of the least square method can be evaluated.

[Equation 8]

$$\begin{pmatrix} dd1 \\ dd2 \\ dd3 \\ dd4 \\ dd5 \\ dd6 \\ dd7 \\ dd8 \\ dd9 \end{pmatrix} = -\begin{pmatrix} B(1,1) & B(1,2) & B(1,3) & \cdots & B(1,9) \\ & \vdots & & \ddots & \vdots \\ B(9,1) & & & \cdots & B(9,9) \end{pmatrix}^{-1} \begin{pmatrix} dR1 \\ dR2 \\ dR3 \\ dR4 \\ dR5 \\ dR6 \\ dR7 \\ dR8 \\ dR9 \end{pmatrix} \quad (8)$$

In Step S19, the CPU 10*a* determines whether the nine differences dd1 to dd9 obtained in Step S18 satisfy the following Equation (9), if the Equation (9) is determined to be satisfied (Y in Step S19), the process proceeds to Step S21, assuming that the optimal solution of the least square method has been obtained at that time since each of the differences dd1 to dd9 is sufficiently close to zero, and otherwise (N in Step S19), the process proceeds to Step S20, assuming that each of the differences dd1 to dd9 is large and the optimal solution of the least square method has not been obtained. Note that the right side of the Equation (9) is not limited to $10^{-12}$, and a predetermined value that can be determined to be close to zero can be used.

[Equation 9]

$$dd1, dd2, dd3, \ldots, dd9 < 10^{-12} \quad (9)$$

In Step S20, the CPU 10*a* updates each of the coefficients A1 to A9 based on the following Equation (10), assuming that each of the differences dd1 to dd9 is large and the optimal solution of the least square method has not been obtained. Note that in Step S20, when the coefficients A1 to A9 are updated, the process proceeds to Step S13 again, and processing in Steps S13 to S19 to which a least square method has been applied using new coefficients A1 to A9.

[Equation 10]

$$\begin{pmatrix} A1 \\ A2 \\ A3 \\ A4 \\ A5 \\ A6 \\ A7 \\ A8 \\ A9 \end{pmatrix} = \begin{pmatrix} A1 + dd1 \\ A2 + dd2 \\ A3 + dd3 \\ A4 + dd4 \\ A5 + dd5 \\ A6 + dd6 \\ A7 + dd7 \\ A8 + dd8 \\ A9 + dd9 \end{pmatrix} \quad (10)$$

In Step S21, the CPU 10*a* calculates, by the following Equation (11), a converged value V0 when the open circuit voltage OCV is sufficiently stable for a long period.

[Equation 11]

$$V0 = A1 \cdot \exp(A5 \cdot Tx) + A2 \cdot \exp(A6 \cdot Tx) + A3 \cdot \exp(A7 \cdot Tx) + A4 \cdot \exp(A8 \cdot Tx) + A9 \quad (11)$$

In Step S22, the CPU 10*a* stores the converged value V0 of the open circuit voltage OCV obtained in Step S22 and the coefficients A1 to A9 at that time as the data 10*ca* to the RAM 10*c*. Thus, the open circuit voltage OCV in a stable state is estimated and can be read out from the RAM 10*c* to be utilized as needed.

In Step S23, the CPU 10*a* calculates the state of charge of the chargeable battery 14 based on the converged value V0 of the open circuit voltage OCV obtained in Step S22. Generally, the state of charge of the chargeable battery 14 can be determined uniformly based on a predetermined function from the converged value V0 of the open circuit voltage and the ambient temperature. Thus, the state of charge SOC of the chargeable battery 14 can be estimated by previously obtaining a function conforming with the chargeable battery 14, and executing the calculation in Step S23.

Figure 5:
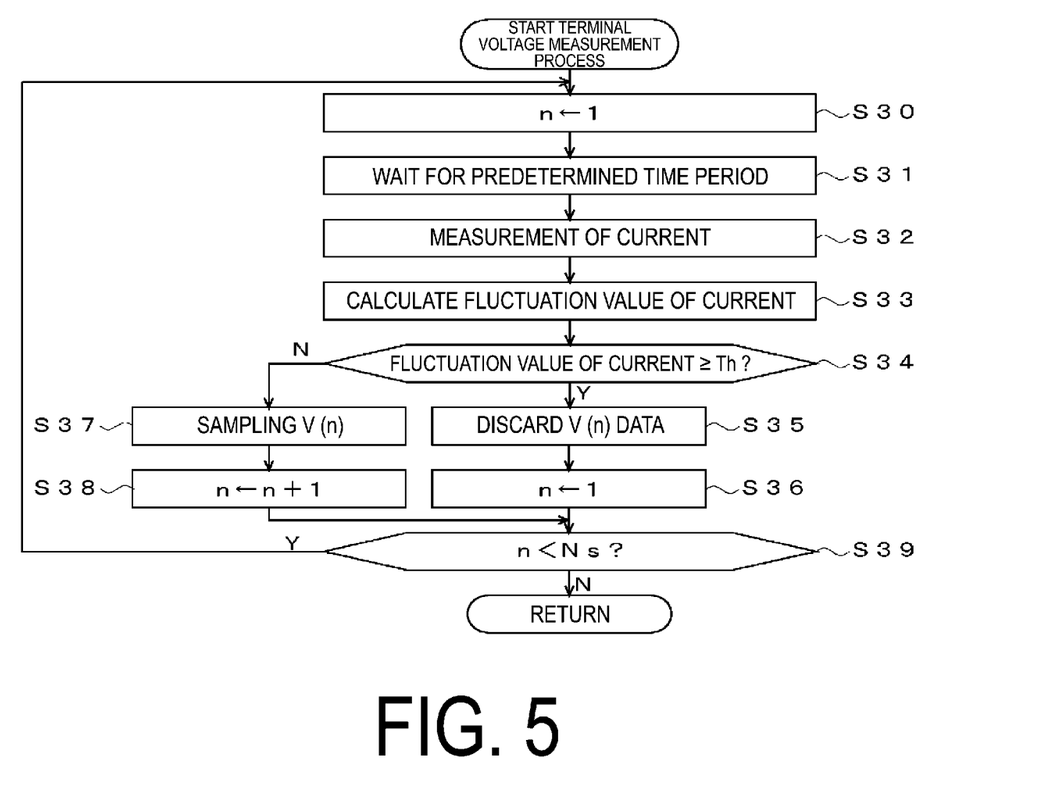
FIG. 5 is a flowchart for explaining an example of a measurement process of a terminal voltage V(n) illustrated in FIG. 4.

Next, details of the measurement process of the terminal voltage V (n) illustrated in FIG. 4 will described with referring to FIG. 5. When processing of the flowchart illustrated in FIG. 5 is started, following steps are executed.

In Step S30, the CPU 10*a* substitutes an initial value 1 for the variable n, the variable n for counting the number of times of processing.

In Step S31, the CPU 10*a* waits until a predetermined amount of time elapses. More specifically, the CPU 10*a* waits until the sampling interval ATs elapses. Note that the sampling interval ATs can be, for example, 10 seconds as described above. As a matter of course, other values may be set.

In Step S32, the CPU 10*a* detects the current flowing in the chargeable battery 14 by referring to the output signal from the current measurement unit 12.

In Step S33, the CPU 10a calculates a fluctuation value of the current. For example, the fluctuation value is obtained from the difference value between the current measurement value and the previous measurement value. Note that instead of obtaining the fluctuation value from the measurement values of two times, the fluctuation value may be obtained from the difference value between an average value of measurement values of a plurality of times and also an average value of measurement values of a plurality of times. Note that the use of the average value in this manner is to eliminate the influence of sudden noise (a voltage fluctuation occurring in a short time that does not affect the fitting process). Alternatively, for example, a standard deviation of the plurality of measurement values may be obtained, and the standard deviation divided by the average value of measurement values of the current may be used to obtain the fluctuation value. The object of the Step S33 is to detect the portion where the voltage waveform changes discontinuously as indicated by the solid line in FIG. 3 from the discontinuous change of the current waveform which causes the voltage change.

In Step S34, the CPU 10a compares the fluctuation value of the current obtained in Step S33 with a predetermined threshold value Th, and if the fluctuation value is equal to the predetermined threshold value Th or greater (Y in Step S34), the processing proceeds to Step S35, and otherwise (N in Step S34) proceeds to Step S37. As an example, if the fluctuation value of current is from 0.05 to 0.5 A, it is determined as Y, and the process proceeds to Step S35. As a matter of course, the threshold value varies depending on the type of the vehicle, the type of the load 19, the external temperature, and the like, and thus may be a value other than that described above. As a specific example, in the example of FIG. 3, when the fitting starts at the time T1, the current indicated by the dashed line fluctuates by approximately 0.1 A at the time T2. The current also fluctuates by approximately 0.1 A, at the time T3. Thus, it is determined as Y at the time T1 and the time T2, and the process proceeds to Step S35.

In Step S35, the CPU 10a discards the data of the voltage sample value V (n). In other words, all data stored, as the voltage sample value V (n), in the data 10ca of the RAM 10c is discarded.

In Step S36, the CPU 10a substitutes 1 for the variable n, the variable n for counting the number of times of processing. Thus, the voltage sampling value is stored again from V (1). In other words, if the discard of the data of the voltage sample value V (n) is determined, the number of times of processing for the voltage sample value V (n) is reset to zero. Note that information of the number of times of processing is stored in the CPU 10a.

In Step S37, the CPU 10a executes the sampling of the voltage sample value V (n). More specifically, the CPU 10a refers to the signal output from the voltage measurement unit 11, measures the terminal voltage of the chargeable battery 14, and stores the result in V (n).

In Step S38, the CPU 10a increments the value of the variable n by 1, the variable n for counting the number of times of processing.

In Step S39, the CPU 10a determines whether the variable n for counting the number of times of processing is smaller than a constant Ns, and if it is determined that n<Ns holds (Y in Step S39), the process returns to Step S30, and processing similar to that described above is repeated. Otherwise (N in Step S39) the process returns to the original process. In other words, in the present embodiment, the fitting process is performed on a predetermined number or greater of the voltage sample values V (n), and the OCV is calculated. Note that when the discard of the voltage sample value V (n) is executed, the number of the discarded voltage sample value V (n) is not included in the predetermined number.

As explained above, in the embodiments of the disclosure, when the sampling of the voltage sample value V (n) is executed, the current value is sampled together and the voltage sample value V (n) by then is discarded if the fluctuation value of voltage is equal to the predetermined threshold value or greater. Thus, for example, as illustrated in FIG. 3, when the current value fluctuates, the voltage value also fluctuates according to the fluctuation of the current value. Thus, for example, when the current value fluctuates at the times T2 and T3, the voltage value also fluctuates, and as indicated by the solid line in FIG. 3, the voltage value is in a state of changing discontinuously. In such a case, even if the fitting is executed using a function, an accurate fitting cannot be performed. Thus, in the present embodiment, when the fluctuation value of current is equal to the predetermined threshold value or greater, such a problem can be avoided by discarding the voltage sample value V (n) measured by then.

In the example of FIG. 3, the sampling is started from the time T1, but the voltage sample value is discarded to reset to n=1 since the fluctuation value of current is greater than the threshold value at the time T2, and the voltage sample value V (n) is measured from the beginning. In the example of FIG. 3, the voltage sample value is discarded to reset to n=1 since the fluctuation value of current is greater than the threshold value also at the time T3, and the voltage sample value V (n) is measured from the beginning. As a result, in the example of FIG. 3, the sampling is executed from immediately after the time T3 to the time T4, and the open circuit voltage OCV can be obtained.

(C) Description of Modified Embodiments

It goes without saying that the above embodiment is merely an example, and the disclosure is not limited only to the case as described above. For example, in the above-described embodiment, the function of fourth order is used as the exponential decay function, but an exponential decay function of third order or less or fifth order or greater may be used.

Figure 6:
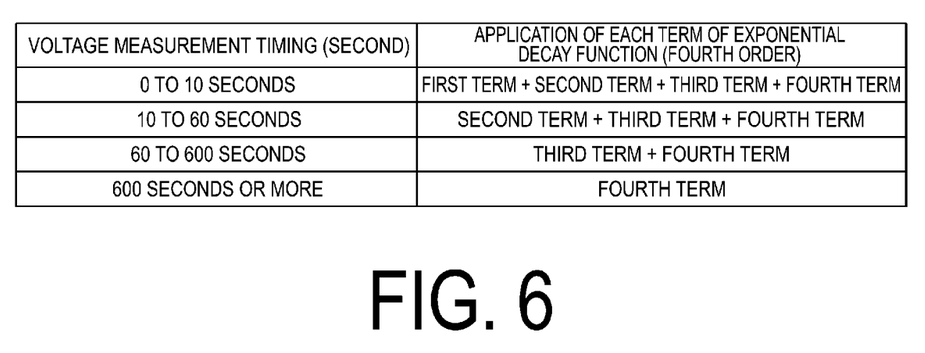
FIG. 6 is a diagram illustrating a relationship between a voltage measurement timing and the number of terms of the exponential decay function.

In addition, the order of the exponential decay function may be changed according to the timing of starting the measurement. Specifically, as illustrated in FIG. 6, when the measurement start timing is from 0 second to 10 seconds, an exponential decay function having a shape including all of the first term to the fourth term is applied. This is because in such an initial stage, since the influence of each term of the exponential decay function is relatively large, it is necessary to perform the calculation by applying the original exponential decay function of fourth order using all of the four terms in order to ensure sufficiently accurate calculation.

In contrast, at a timing when 10 seconds have elapsed from the start time point of the arithmetic processing, since the first term of the exponential decay function decays to a negligible degree, an exponential decay function having a shape including the second term to the fourth term except for the first term is applied. At a timing when 60 seconds have elapsed from the start time point of the arithmetic processing, since the second term in addition to the first term of the exponential decay function decay to a negligible degree, an exponential decay function having a shape including the third term and the fourth term except for the first term and the second term is applied. At a timing when 600 seconds have elapsed from the start time point of the arithmetic processing, since the third term in addition to the first term and the second term of the exponential decay function decay to a negligible degree, an exponential decay function having a shape including only the fourth term except for the first term to the third term is applied.

Thus, for example, if it is determined that the fluctuation value of current >Th and the V (n) data is discarded by the process illustrated in FIG. 5, since the measurement is to be performed from the beginning, the number of terms in the exponential decay function may be reduced according to the table shown in FIG. 6. For example, as illustrated in FIG. 3, in a case in which V (n) data is discarded at the time T2 and the measurement is resumed 800 seconds after the start of the calculation, only the fourth term may be used.

For example, in the above-described embodiment, the exponential decay function is used, but alternatively, for example, an inverse proportional curve may be used.

Further, in the above-described embodiment, in Step S34 of FIG. 5, if the fluctuation value of the current is greater than the threshold value, all the voltage samples V (n) are discarded. However, instead of discarding all the voltage samples V (n), only the data in the vicinity where the fluctuation is large may be discarded.

In addition, when the sufficient data required for the fitting cannot be measured due to the discard, the threshold value Th in Step S34 may be changed. For example, when the discard is repeated and the measurement of open circuit voltage OCV cannot be executed at a desired frequency (for example, once a day or every two days), the threshold value Th may be increased until the measurement can be executed at the desired frequency. When the measurement is executed at the desired frequency, the threshold value Th may be reduced to increase the accuracy.

In the above-described embodiment, in the flowchart of FIG. 5, the necessity of the discard is determined by comparing the fluctuation value of the current and the threshold value, but the necessity of the discard may be determined based on the fluctuation value of the voltage. For example, when the fluctuation value of the voltage is greater than the predetermined threshold value, the measurement data by then may be discarded, or when the fluctuation value of the voltage and the fluctuation value of the current are both greater than the predetermined threshold value, the measurement data may be discarded.

Furthermore, when a fluctuation of the voltage value being equal to or greater than a predetermined threshold value or greater is repeated a predetermined number of times or more before the number of the voltage value stored in the CPU 10a becomes equal to a predetermined number or greater, the detection of the state of the chargeable battery may be stopped.

Further, in the above-described embodiment, the process of obtaining the SOC from the open circuit voltage OCV has been described. However the generated voltage of the alternator 16 may be controlled based on the SOC obtained in this manner, so that the chargeable battery 14 may be controlled in order to be prevented from being overdischarged or overcharged and become the predetermined SOC. According to such a control, the engine 17 can be prevented from being unable to resume, and thus, the fuel consumption efficiency can be improved by, for example, an idle reduction in which the engine 17 stops when the vehicle is idling. In addition, by preventing overcharge, the load of the engine 17 can be reduced, and the fuel consumption efficiency can be improved as well. Note that in the example illustrated in FIG. 1, the control unit 10 controls the charge and discharge. However, the ECU (not illustrated) may receive the data of the SOC or the OCV and the like from the control unit 10 and may control the charge and discharge based on these values.

In addition, in the above-described embodiments, the influence caused by the temperature is not described, but the OCV may be measured in consideration of the temperature detected by the temperature measurement unit 13. For example, the measured voltage may be corrected to a voltage at standard temperature and the OCV may be calculated based on the voltage resulting from the correction.

In the above-described embodiments, the chargeable battery state detecting apparatus 1 including the discharge circuit 15 is described, but it may be configured such that the discharge circuit 15 is not included. Even if the chargeable battery state detection apparatus 1 does not include the discharge circuit 15, the OCV can be calculated as described above.

Further, the flowcharts illustrated in FIG. 4 and FIG. 5 are merely examples, and the disclosure is not limited only to the processing of those flowcharts.

REFERENCE SIGNS LIST

1 Chargeable battery state detection apparatus
10 Control unit
10a CPU
10b ROM
10c RAM
10d Communication unit
10e I/F
11 Voltage detecting unit (voltage measurement unit)
12 Current detecting unit (current measurement unit)
13 Temperature detecting unit (temperature measurement unit)
14 Chargeable battery
15 Discharge circuit
16 Alternator
17 Engine
18 Starter motor
19 Load

The invention claimed is:

1. An apparatus, comprising:
   a processor, communicatively coupled to a memory that stores computer-executable instructions, that executes or facilitates execution of the computer-executable instructions to perform operations comprising:
   determining a state of charge of a chargeable battery of a vehicle, wherein the determining comprises:
   measuring, using at least one measuring device, voltage values and current values of the chargeable battery concurrently at different times after charge and discharge of the chargeable battery is stopped,
   storing the voltage values and the current values,
   fitting, with respect to the voltage values, by adjusting coefficients of an exponential decay function having one or more terms,
   determining an open circuit voltage based on the exponential decay function,
   discarding all stored voltage values when a current value or a voltage value measured by the at least one measuring device fluctuates by at least a threshold value from a previous current value or a previous voltage value measured by the at least one measuring device, and determining the state of charge of the chargeable battery based on the open circuit voltage; and adjusting, by the chargeable battery or by an electric control unit (ECU) of the vehicle, charge control of the chargeable battery based on the state of charge, wherein the charge control comprises controlling generated voltage output of an alternator of the vehicle for at least one of:

controlling charging of the chargeable battery by one or more power sources, or controlling discharging of the chargeable battery by one or more loads of the vehicle.

2. The apparatus of claim 1,
wherein the discarding comprises:
in response to resuming the measuring of voltage values after all of the voltage values are discarded, reducing a number of terms in the exponential decay function according to an elapsed time beginning from the measuring of the voltage values prior to the discarding.

3. The apparatus of claim 1, wherein the operations further comprise, in response to not being able to determine the open circuit voltage for at least a predetermined period due to execution of the discarding, increasing the threshold value.

4. The apparatus of claim 1, wherein the operations further comprise:
recording a count of the measurements of the voltage values, and
in response to executing the discarding, resetting the count of the measurements to zero.

5. The apparatus of claim 1, wherein the fitting is executed on a predetermined number of the voltage values, and
a number of the voltage values discarded are not included in the predetermined number.

6. The apparatus of claim 1, wherein the operations further comprise:
in response to executing the discarding a predetermined number of times before storing a defined number of voltage values, stopping the determining of the state of charge of the chargeable battery.

7. A method, comprising:
determining, by a system comprising a processor, a state of charge of a chargeable battery of a vehicle, wherein the determining comprises:
measuring, using at least one measuring device, voltage values and current values of the chargeable battery concurrently at different times after charge and discharge of the chargeable battery is stopped,
storing the voltage values and the current values,
recording a count of the measurements of the voltage values,
fitting, with respect to the voltage values, by adjusting coefficients of a function,
calculating an open circuit voltage based on the function,
discarding at least a part of the voltage values when a current value or a voltage value measured by the at least one measuring device fluctuates by at least a threshold value from a previous current value or a previous voltage value measured by the at least one measuring device, wherein the discarding comprises resetting the count of the measurements to zero, and
determining the state of charge of the chargeable battery based on the open circuit voltage; and
adjusting, by the chargeable battery or by an electric control unit (ECU) of the vehicle, charge control of the chargeable battery based on the state of charge, wherein the charge control comprises controlling generated voltage output of an alternator of the vehicle for at least one of:
controlling charging of the chargeable battery by one or more power sources, or
controlling discharging of the chargeable battery by one or more loads of the vehicle.

8. The method of claim 7, wherein the function is an exponential decay function having one or a plurality of terms; or an inverse proportion function.

9. The method of claim 7, wherein the discarding comprises discarding all stored voltage values.

10. The method of claim 9, wherein the function is an exponential decay function having a plurality of terms, and the determining of the state of charge further comprises:
in response to resuming the measuring of voltage values after all of the voltage values are discarded, reducing a number of terms in the exponential decay function according to an elapsed time beginning from the measuring of the voltage values prior to the discarding.

11. The method of claim 7, wherein the determining of the state of charge further comprises, in response to being unable to determine the open circuit voltage for at least a predetermined period due to execution of the discarding, increasing the threshold value.

12. The method of claim 7, wherein the fitting is executed on a predetermined number of the voltage values, and a number of the voltage values discarded are not included in the predetermined number.

13. The method of claim 7, wherein the determining of the state of charge further comprises:
in response to executing the discarding a predetermined number of times before storing a defined number of voltage values, stopping the determining of the state of charge of the chargeable battery.

14. An apparatus, comprising:
a processor, communicatively coupled to a memory that stores computer-executable instructions, that executes or facilitates execution of the computer-executable instructions to perform operations comprising:
determining a state of charge of a chargeable battery of a vehicle, wherein the determining comprises:
measuring, using at least one measuring device, voltage values and current values of the chargeable battery concurrently at different times after charge and discharge of the chargeable battery is stopped,
storing the voltage values and the current values,
fitting, with respect to the voltage values, by adjusting coefficients of a function, wherein the fitting is executed on a predetermined number of the voltage values, and a number of the voltage values discarded are not included in the predetermined number,
calculating an open circuit voltage based on the function,
discarding at least a part of the voltage values when a current value or a voltage value measured by the at least one measuring device fluctuates by at least a threshold value from a previous current value or a previous voltage value measured by the at least one measuring device, and
determining the state of charge of the chargeable battery based on the open circuit voltage; and
adjusting, by the chargeable battery or by an electric control unit (ECU) of the vehicle, charge control of the chargeable battery based on the state of charge, wherein the charge control comprises controlling generated voltage output of an alternator of the vehicle for at least one of:
controlling charging of the chargeable battery by one or more power sources, or
controlling discharging of the chargeable battery by one or more loads of the vehicle.

15. The apparatus of claim 14, wherein the function is an exponential decay function having a plurality of terms, and the determining of the state of charge further comprises:
in response to resuming measuring voltage values after all of the voltage values are discarded, reducing a number of terms in the exponential decay function according to an elapsed time from a beginning of the measuring of the voltage values prior to the discarding.

16. The apparatus of claim 14, wherein the determining of the state of charge further comprises, in response to not being able to determine the open circuit voltage for at least a predetermined period due to execution of the discarding, increasing the threshold value.

17. The apparatus of claim 14, wherein the determining of the state of charge further comprises:
recording a count of the measurements of the voltage values, and
wherein the discarding comprises resetting the count of the measurements to zero.

18. The apparatus of claim 14, wherein the determining of the state of charge further comprises:
in response to executing the discarding a predetermined number of times before storing a defined number of voltage values, stopping the determining of the state of charge of the chargeable battery.

19. The apparatus of claim 14, wherein the at least one measuring device comprises at least one voltage measuring unit.

20. The apparatus of claim 14, wherein the at least one measuring device comprises at least one current measuring unit.

* * * * *